(12) United States Patent
Huli et al.

(10) Patent No.: US 12,393,121 B2
(45) Date of Patent: Aug. 19, 2025

(54) POINT-OF-USE BLENDING OF RINSE SOLUTIONS FOR EUV PROCESSING TO MITIGATE PATTERN COLLAPSE

(71) Applicant: Tokyo Electron Limited, Tokyo (JP)

(72) Inventors: Lior Huli, Albany, NY (US); Naoki Shibata, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/336,508

(22) Filed: Jun. 16, 2023

(65) Prior Publication Data

US 2023/0324808 A1 Oct. 12, 2023

Related U.S. Application Data

(62) Division of application No. 16/674,124, filed on Nov. 5, 2019, now Pat. No. 11,762,297.

(60) Provisional application No. 62/831,465, filed on Apr. 9, 2019.

(51) Int. Cl.
| | |
|---|---|
| *G03F 7/40* | (2006.01) |
| *B08B 3/08* | (2006.01) |
| *G03F 7/20* | (2006.01) |
| *H01L 21/02* | (2006.01) |
| *H01L 21/027* | (2006.01) |

(52) U.S. Cl.
CPC .................. *G03F 7/40* (2013.01); *B08B 3/08* (2013.01); *G03F 7/2004* (2013.01); *H01L 21/0206* (2013.01); *H01L 21/0274* (2013.01)

(58) Field of Classification Search
CPC .......... G03F 7/405; G03F 7/40; G03F 7/3028; G03F 7/2004
See application file for complete search history.

(56) References Cited

U.S. PATENT DOCUMENTS

| | | | |
|---|---|---|---|
| 5,968,268 A | 10/1999 | Kitano et al. | |
| 6,872,014 B1 | 3/2005 | Paxton | |
| 9,081,291 B2 | 7/2015 | Park et al. | |
| 2003/0044731 A1 | 3/2003 | Yoshihara et al. | |
| 2015/0128995 A1 | 5/2015 | Kaneko et al. | |
| 2017/0255101 A1 | 9/2017 | Wang | |

FOREIGN PATENT DOCUMENTS

| | | |
|---|---|---|
| CN | 1696834 A | 11/2005 |
| CN | 1717632 A | 1/2006 |
| CN | 101473271 A | 7/2009 |
| JP | 2004-14713 A | 1/2004 |
| JP | 2007-95888 A | 4/2007 |
| JP | 2012-211949 A | 11/2012 |
| JP | 2013-69840 A | 4/2013 |
| JP | 2015-23172 A | 2/2015 |
| TW | I519910 B | 2/2016 |
| TW | 201638679 A | 11/2016 |

OTHER PUBLICATIONS

Combined Taiwan Office Action and Search Report issued Oct. 13, 2023 in Taiwan Patent Application No. 109111717 (with English Translation), 15 pages.
Office Action issued Feb. 6, 2024, in corresponding Japanese Patent Application No. 2020-069466 (with English Translation), 10 pages.
Office Action issued Nov. 13, 2024 in Chinese Patent Application No. 202010273764.3, filed Apr. 9, 2020, with English translation, 38 pages.
Chinese Office Action dated Feb. 12, 2025, issued in corresponding Chinese patent Application No. 202010273764.3, 14 pages.

*Primary Examiner* — Daborah Chacko-Davis
(74) *Attorney, Agent, or Firm* — Oblon, McClelland, Maier & Neustadt, L.L.P.

(57) ABSTRACT

Embodiments provide point-of-use blending of photoresist rinse solutions for patterned photoresists. Disclosed methods and systems form different mitigation solutions for multiple different photoresists through point-of-use variable blending of a mitigation solution with de-ionized water and/or other chemistries to adjust the formulation of the solution just prior to dispense within a process chamber. For one example embodiment, different surfactant rinse solutions are used for different photoresists, such as different extreme ultraviolet photoresists. In addition, the level of reactive components, the level of nonreactive components, or both within a mitigation solution can be adjusted using this point-of-use blending to provide an adjusted mitigation solution. The ability to make point-of-use adjustments to the solution chemistry just before dispense on a microelectronic workpiece, such as a semiconductor wafer, improves interactions between the adjusted mitigation solution and the patterned photoresist.

13 Claims, 5 Drawing Sheets

POINT-OF-USE BLENDING OF RINSE SOLUTIONS FOR EUV PROCESSING TO MITIGATE PATTERN COLLAPSE

RELATED APPLICATIONS

This application is a divisional of U.S. patent application Ser. No. 16/674,124, filed on Nov. 5, 2019, which claims the benefit of priority from U.S. Provisional Patent Application No. 62/831,465, entitled "POINT-OF-USE BLENDING OF RINSE SOLUTIONS FOR EUV PROCESSING TO MITIGATE PATTERN COLLAPSE", filed on Apr. 9, 2019, the entire contents of each of which are herein incorporated by reference.

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, processing flows are being requested to reduce feature size while maintaining structure integrity for various patterning processes.

One technique that has been developed to achieve these reduced feature sizes is extreme ultra-violet (EUV) lithography. As the industry continues to push the limits of integrated circuit fabrication based on EUV lithography, pattern collapse has increasingly become a relevant concern. Pattern collapse in lithography refers to the deformation, and subsequent collapse, of features formed in patterned photoresist. This pattern collapse often occurs during the drying steps of development processes used to form the patterned layers. For example, pattern collapse is often caused by unbalanced capillary forces that act on features during drying steps within a standard development process.

FIG. 1 (Prior Art) provides an example diagram of a representative embodiment 100 showing capillary forces 118 associated with two adjacent features 104 for the patterned photoresist caused by a rinse solution 110 between the two features 104. The two features 104 have been formed on a substrate 102 for a microelectronic workpiece being processed, and the substrate 102 can include one or more material layers. Each of the example features 104 have a height (H) 106 and a width (W) 108, and the features 104 are spaced by a distance (D) 112. The rinse solution 110 fills the space between the features 104, and s contact angle (θ) 116 is formed with respect to the surface of the rinse solution 110.

A surface tension (y) 114 for the rinse solution 110 causes the capillary force 118 to be exerted inwardly from the features 104 as shown. The key parameter for capillary force 118 on the photoresist features 104 is the surface tension (y) 114. The capillary force 118 can be represented by the following equation:

$$\sigma > \frac{6y\cos\theta}{D}\left(\frac{H}{W}\right)$$

For this equation, "σ" represents the maximum stress applied by the capillary force 118 to the pattern features 104; "y" represents the surface tension 114 of the rinse solution 110; "θ" represents the contact angle 116; "H" represents the height 106 of the pattern; "D" represents the pitch or distance 112 between features 104 of the pattern; "W" represents the width 108 of the pattern features 104; and "H/W" represents the aspect ratio. Thus, it is seen that the capillary force (σ) 118 is dependent upon the surface tension (y) 114 of the rinse solution 110 as well as the pitch or distance (D) 112 for the pattern.

The capillary force 118 has caused pattern collapse to become an increasing problem as feature size has shrunk. First, the reduction in feature size has increased the rigidity of features, such as features 104, for the patterned photoresist. This rigidity combined with the capillary force 118 leads to pattern collapse in patterned photoresist. This pattern collapse causes defects in patterns transferred to underlying layers.

Mitigation solutions have been developed to overcome problems with pattern collapse. These mitigation solutions include one or more components that help to reduce or eliminate pattern collapse. One mitigation solution is a surfactant rinse that helps reduce capillary forces caused by surface tension that accompanies traditional de-ionized water (DIW) rinses. One type of surfactant rinse offered by Tokyo Electron Limited (TEL) is FIRM™, which is a surfactant rinse treatment for EUV lithography. In addition, different formulations of FIRM™ surfactant rinses can also be used for FIRM™ rinse treatments.

FIG. 2 (Prior Art) provides an example embodiment 200 that demonstrates how a surfactant rinse treatment, such as FIRM™, is typically incorporated into a traditional development process flow. In block 202, a photoresist is applied to a substrate for a microelectronic workpiece being processed, and the substrate can include one or more material layers. In block 204, the photoresist is developed to form a patterned photoresist by exposing the photoresist to light, such as EUV light. One example of an EUV photoresist developer is a TMAH (tetramethylammonium hydroxide). In block 206, a rinse step is performed to remove the non-exposed photoresist from the substrate. DIW is typically used for this rinse step. In block 208, a surfactant rinse treatment, such as FIRM™, is performed to reduce surface tension caused by any DIW remaining within the patterned photoresist. In block 210, a dry-out step follows to dry the remaining solutions on the patterned photoresist and substrate. The development process then finishes, and the microelectronic workpiece is further processed. It has been found, for example, that the FIRM™ treatment process achieves a wider lithography process margin without pattern collapse as compared to DIW rinse alone.

The surfactant rinse treatment can be conducted using a wide variety of solutions with different formulations, such as different formulations of FIRM™ solutions. The efficacy any particular FIRM™ solution formulation is highly dependent upon the polymer components for the photoresist being used in the lithography process. As such, the preferred or optimal formulation for a FIRM™ solution is highly depended on photoresist polymer components and photoresist physical properties such as functional groups, solvent type, hydrophobicity, contact angle, and/or other photoresist parameters.

FIG. 3 (Prior Art) provides a representative embodiment 300 of image diagrams of example photoresist patterns with respect to critical dimension (CD) margins 310 of a particular photoresist (Resist A) that was treated with FIRM™ solutions with different formulations, which are designated in FIG. 3 as FIRM A, FIRM B, FIRM C, and FIRM D. When FIRM A was applied to the photoresist as shown in row 302, a CD margin of about 21 nanometers (nm) was achieved with pattern collapse indicated by image diagram 312. When FIRM B was applied to the photoresist as shown in row 304, a CD margin of about 21.4 nm was achieved with pattern collapse indicated by image diagram 314. When FIRM C was applied to the photoresist as shown in row 306, a CD margin of about 20.9 nm was achieved with pattern collapse indicated by image diagram 316. When FIRM D was applied to the photoresist as shown in row 308, a CD margin of about 22.4 nm was achieved with pattern collapse indicated by image diagram 318. As shown, therefore, pattern collapse occurs at different points for the different FIRM™ solutions, and FIRM D shows a wider collapse margin for the photoresist. It is noted that the CD margins 310 represent an indication of the total range of exposure energy that can be tolerated to prevent the resulting pattern feature from collapse, and a higher number is preferred, such as was achieved with FIRM D for the examples in FIG. 3.

Due to the variations as represented by FIG. 3, one formulation for a surfactant rinse solution of solution, such as a formulation for a particular FIRM™ treatment, is typically not suitable for multiple different photoresists. Further, non-optimized combinations of a photoresist with a surfactant solution rinse and treatment process can cause increases in post-development defects for the photoresist including pattern collapse defects. For example, non-optimized combinations of a photoresist with a FIRM™ solution can cause photoresist swelling or melting and can increase post development defects such as pattern collapse, photoresist residue, water marks, and/or other defects.

SUMMARY

Embodiments are described herein for point-of-use blending of photoresist rinse solutions for patterned photoresists. The disclosed embodiments in part provide methods and systems that form different mitigation solutions for multiple different photoresists through point-of-use variable blending of a mitigation solution with de-ionized water and/or other chemistries to adjust the formulation of the solution prior to dispense within a process chamber. For one example embodiment, different surfactant rinse solutions are used for different photoresists, such as different extreme ultraviolet photoresists. In addition, the level of reactive components, the level of nonreactive components, or both within a mitigation solution can be adjusted using this point-of-use blending to provide an adjusted mitigation solution. The ability to make point-of-use adjustments to the solution chemistry just before dispense on a microelectronic workpiece, such as a semiconductor wafer, improves interactions between the adjusted mitigation solution and the patterned photoresist. Different or additional features, variations, and embodiments can also be implemented, and related systems and methods can be utilized as well.

For one embodiment, a method to dispense a rinse solution to mitigate pattern collapse for a patterned photoresist is disclosed including providing a mitigation solution with a first formulation in a reservoir associated with a process chamber, adjusting the mitigation solution to form an adjusted mitigation solution with a second formulation based upon a type of a patterned photoresist formed on a substrate for a microelectronic workpiece positioned within the process chamber, and dispensing the adjusted mitigation solution with the second formulation on the patterned photoresist to rinse the patterned photoresist while mitigating pattern collapse.

In additional embodiments, the adjusted mitigation solution includes one or more mitigation solution components. In further embodiments, the adjusted mitigation solution includes a surfactant rinse solution having the one or more mitigation solution components.

In additional embodiments, the method includes forming the patterned photoresist by exposing portions of a photoresist to extreme ultraviolet (EUV) light. In further embodiments, the photoresist is selected from a plurality of photoresists with different physical properties.

In additional embodiments, the method includes further adjusting the mitigation solution based upon one or more features formed within the patterned photoresist.

In additional embodiments, the adjusting includes adjusting at least one of a level of reactive components or a level of nonreactive components within the mitigation solution. In further embodiments, the adjusting includes injecting one or more components into a mixer with the mitigation solution to form the adjusted mitigation solution.

In additional embodiments, the adjusting includes adjusting a pH level for the mitigation solution.

In additional embodiments, the adjusting includes blending the mitigation solution with at least one of de-ionized water (DIW) or a mitigation solution component. In further embodiments, the blending is performed using a mixer coupled to a dispense nozzle positioned within the process chamber.

In additional embodiments, the dispensing includes initially dispensing de-ionized water (DIW) on the patterned photoresist and subsequently dispensing the adjusted mitigation solution on the patterned photoresist.

In additional embodiments, the dispensing includes initially dispensing de-ionized water (DIW) without the adjusted mitigation solution on the patterned photoresist, adjusting the mitigation solution with DIW to form the adjusted mitigation solution, subsequently dispensing the adjusted mitigation solution on the patterned photoresist, and further dispensing the mitigation solution on the patterned photoresist.

For one embodiment, a system to dispense a mitigation solution to mitigate pattern collapse for a patterned photoresist is disclosed including a process chamber for a microelectronic workpiece, a reservoir containing a mitigation solution with a first formulation, a mixer coupled to receive the mitigation solution from the reservoir and to receive one or more mitigation solution components based upon a type of a patterned photoresist formed on a substrate for a microelectronic workpiece positioned within the process chamber where the mixer has an adjusted mitigation solution with a second formulation as an output, and a nozzle coupled to receive the adjusted mitigation solution and positioned within the process chamber to dispense the adjusted mitigation solution on the patterned photoresist to rinse the patterned photoresist while mitigating pattern collapse.

In additional embodiments, the system includes a controller coupled to the reservoir and to one or more additional reservoirs holding the one or more mitigation solution components, and the controller is configured to determine a formulation for the adjusted mitigation solution. In further embodiments, the controller is further configured to determine the formulation based upon one or more features formed within the patterned photoresist.

In additional embodiments, the adjusted mitigation solution includes a surfactant rinse solution having the one or more mitigation solution components.

In additional embodiments, the patterned photoresist includes an extreme ultraviolet (EUV) photoresist. In further embodiments, the EUV photoresist is selected from a plurality of EUV photoresists with different physical properties.

In additional embodiments, the system includes a substrate holder positioned within the process chamber to hold the microelectronic workpiece, and the substrate holder is rotatable to facilitate removal of the adjusted mitigation solution.

In additional embodiments, the adjusted mitigation solution includes at least one of an adjusted level of reactive components or an adjusted level of nonreactive components within the mitigation solution. In further embodiments, the adjusted mitigation solution includes an adjusted pH level for the solution.

In additional embodiments, the system includes a controller configured to cause an initial dispensing of de-ionized water (DIW) on the patterned photoresist and a subsequent dispensing of the adjusted solution on the patterned photoresist.

In additional embodiments, the system includes a controller configured to cause an initial dispensing of de-ionized water (DIW) on the patterned photoresist, a subsequent dispensing of the adjusted mitigation solution on the patterned photoresist where the adjusted mitigation solution includes DIW as one of the one or more additional mitigation solution components, and a further dispensing of the mitigation solution on the patterned photoresist.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Methods and related systems are disclosed for point-of-use blending of rinse solutions to mitigate pattern collapse for patterned photoresists. The disclosed embodiments in part provide methods and systems for a single source of different surfactant rinse solutions, such as FIRM™ solutions, that are used to rinse different types of photoresists through point-of-use variable blending. For any particular application, the solution formulation is a chemical mixture with a controlled ratio of reactive and nonreactive components. As described herein, the chemical composition ratio of nonreactive to reactive components for the surfactant rinse solution is adjusted just before it is dispensed on a substrate for a microelectronic workpiece being processed. For one embodiment, the chemical formulation adjustment is performed as a point-of-use blending within a mixer before being passed through a dispense nozzle within a process chamber. The ability to use a single source to dispense different formulations based upon which of multiple different photoresists is being used improves processing efficiency. The complexity of the delivery systems is reduced, and manufacturing floor space requirements for related processing systems is also reduced. For one embodiment, the surfactant rinse solutions are blended at point-of-use for extreme ultraviolet (EUV) lithography using EUV photoresists. Other advantages and implementations can also be achieved while still taking advantage of the process techniques described herein.

As described above, non-optimized combinations of a photoresist with a surfactant solution rinse and treatment process can cause increases in post-development defects for the photoresist including pattern collapse defects. To overcome this issue, an individual formulation is typically optimized by users to a specific photoresist being used in the process flow. If multiple different photoresists are being used, then different formulations are needed. As such, a number of different formulations are typically required by users where different types of photoresists are used in their process flows. However, this need for different formulations, such as different FIRM™ solution formulations, increases costs. For different FIRM™ solutions, each of the formulations is typically prepared by a third-party vendor. Each of the resulting FIRM™ solutions is then shipped to the end-user manufacturing site, where the FIRM™ solution is stored until needed for the particular photoresist for which it was formulated.

During operations, the appropriate FIRM™ solution is loaded into the processing system at the time of use depending upon the photoresist being applied for that particular process flow. This leads to processing inefficiencies. One potential solution to this efficiency problem is to provide a different reservoir and associated delivery system for each of the different surfactant rinse solutions being used with respect to the processing equipment.

Figure 1:
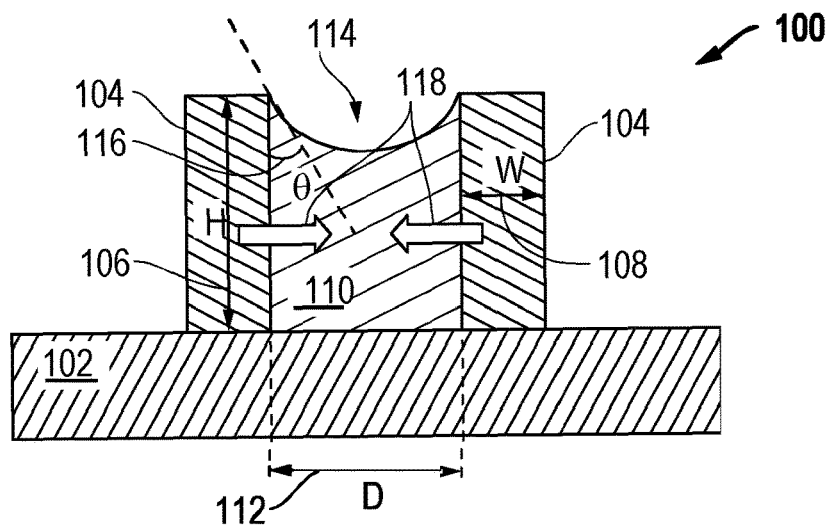
FIG. 1 (Prior Art) provides an example diagram of a representative embodiment showing capillary forces associated with two adjacent features for a patterned photoresist that are caused by a rinse solution between the two features.
Figure 2:
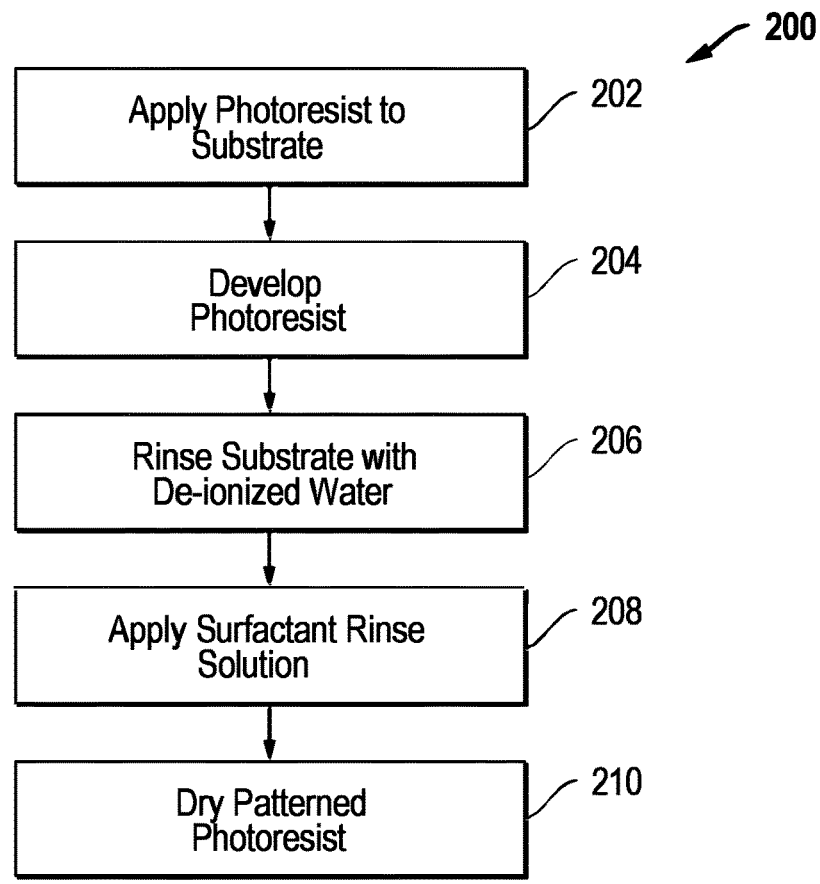
FIG. 2 (Prior Art) provides an example embodiment that demonstrates how a surfactant rinse treatment, such as FIRM™, is typically incorporated into a traditional development process flow.
Figure 3:
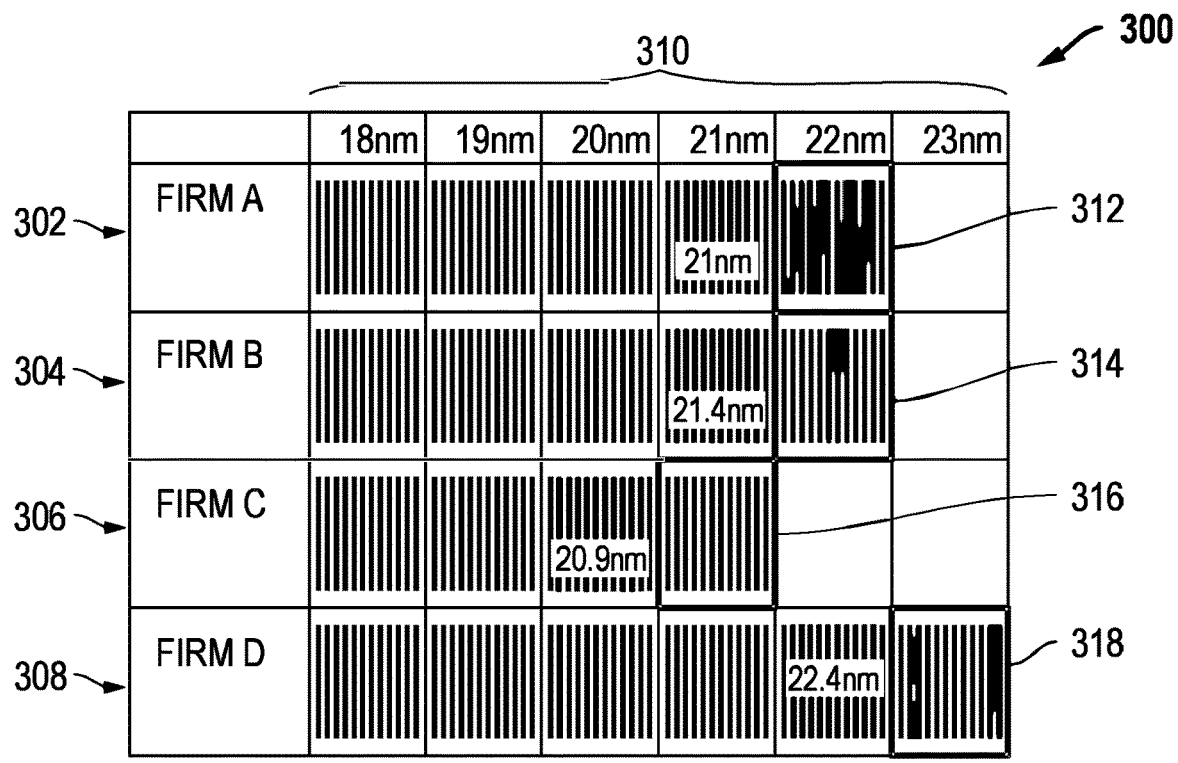
FIG. 3 (Prior Art) provides a representative embodiment of image diagrams of example photoresist patterns with respect to critical dimension (CD) margins of a particular photoresist that was treated with FIRM™ solutions with different formulations.
Figure 4:
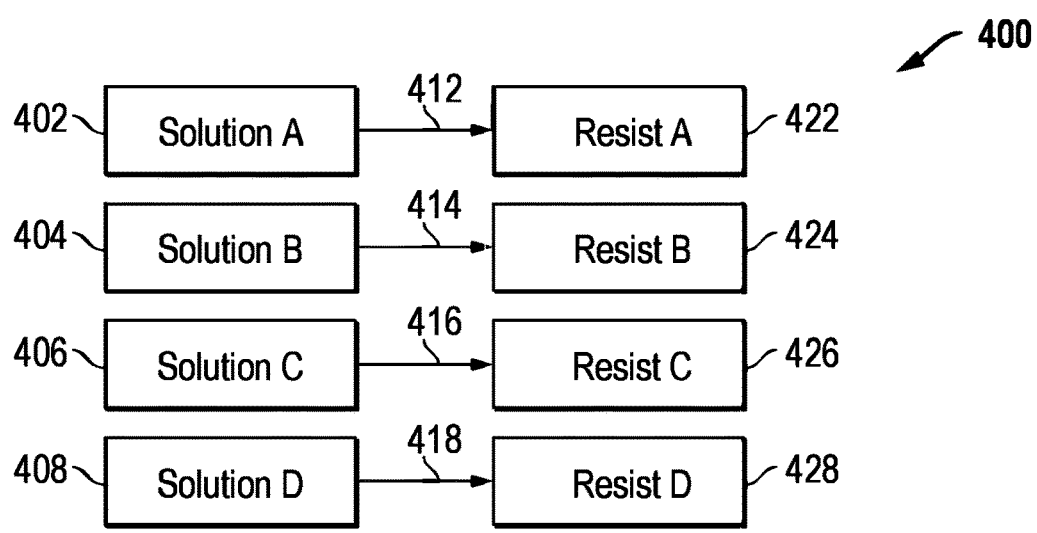
FIG. 4 provides an example embodiment where multiple different reservoirs and associated delivery systems are provided for different mitigation solutions that may be used within processing equipment to provide point-of-use blending.

FIG. 4 provides an example embodiment 400 where multiple different reservoirs and associated delivery systems are provided for different mitigation solutions that may be used within the processing equipment. For example, a first reservoir 402 is provided to hold a first surfactant rinse solution (Solution A), and a first delivery system 412 dispenses this first surfactant rinse solution on a first photoresist (Resist A) 422. A second reservoir 404 is provided to hold a second surfactant rinse solution (Solution B), and a second delivery system 414 dispenses this second surfactant rinse solution on a second photoresist (Resist B) 424. A third reservoir 406 is provided to hold a third surfactant rinse solution (Solution C), and a third delivery system 416 dispenses this third surfactant rinse solution on a third photoresist (Resist C) 426. A fourth reservoir 408 is provided to hold a fourth surfactant rinse solution (Solution D), and a forth delivery system 418 dispenses this first surfactant rinse solution on a fourth photoresist (Resist A) 428. For this embodiment 400, however, each delivery system 412, 414, 416, and 418 would require different pipelines and related nozzles to dispense the different FIRM™ solutions. This requirement for different nozzles and pipelines complicates the structure of the coater/developer delivery tracks as well as increases the cleanroom manufacturing floor space required for processing equipment. As such, the costs to implement the solution of FIG. 4 is significant.

FIGS. 5-8 provide embodiments that avoid the efficiency problems of FIG. 4 while solving problems associated with pattern collapse and the requirement to dispense multiple different rinse solutions. These embodiments provide point-of-use blending of mitigation solutions so that an optimal mitigation solution can be adjusted just before dispense within a process chamber based upon a photoresist actually being selected and used in a process flow. As described below, a mitigation solution with a first formulation is stored within a reservoir associated with a process chamber. The mitigation solution is blended with one or more additional components to form an adjusted mitigation solution with a second formulation based upon the type of photoresist being patterned on a substrate for a microelectronic workpiece positioned within the process chamber. The adjusted mitigation solution with the second formulation is then dispensed on the patterned photoresist to rinse the patterned photoresist while mitigating pattern collapse. For one embodiment, the adjusted mitigation solution is a surfactant rinse solution, such as a FIRM™ solution, that is subjected to point-of-use blending with one or more components to form an adjusted mitigation solution.

As described herein, therefore, the disclosed embodiments provide methods and systems to dispense rinse solutions for development process flows that adjust the rinse solution formulation during the dispense process based upon photoresist formulations and related requirements for each particular process flow. The disclosed systems and methods achieve a number of advantages. For example, a single source FIRM™ solution type can be used for multiple EUV photoresists through point-of-use variable blending of the FIRM™ solution. This single source plus point-of-use adjustment simplifies delivery systems for the mitigation solutions and reduces manufacturing floor space requirements. In addition, disclosed embodiments allow variable blending to be provided within a dispense step so that fine-tuning adjustments and modifications for the formulation of a FIRM™ solution can be achieved more rapidly with respect to a selected photoresist chemistry.

Without the point-of-use blending disclosed herein, prior FIRM™ and photoresist optimization processes were lengthy and required performance at the third-party material vendor site to provide particular FIRM™ formulations. This prior optimization process required samples of initial FIRM™ formulations to be sent to the end user site where the processing equipment and process chambers were located. The samples were then tested with the desired photoresist type and results were returned to the material vendor for further optimization and re-formulation of samples. This formulation/test/re-formulation cycle for the optimization process could be repeated many times and take several weeks or even months to complete. As such, this optimization process was costly and ultimately good only for a single type of photoresist being tested at the end user site. Thus, the optimization process and related formulation/test/re-formulation cycles would have to be repeated for every new photoresist to be used in the end-user processing equipment. In contrast, the methods and systems described herein greatly simplify the optimization process as well as lower the material development cost by allowing point-of-use blending of the formulations for mitigation solutions, such as FIRM™ solutions, based upon a particular photoresist selected from multiple different possible photoresists for a particular process flow.

Figure 5:
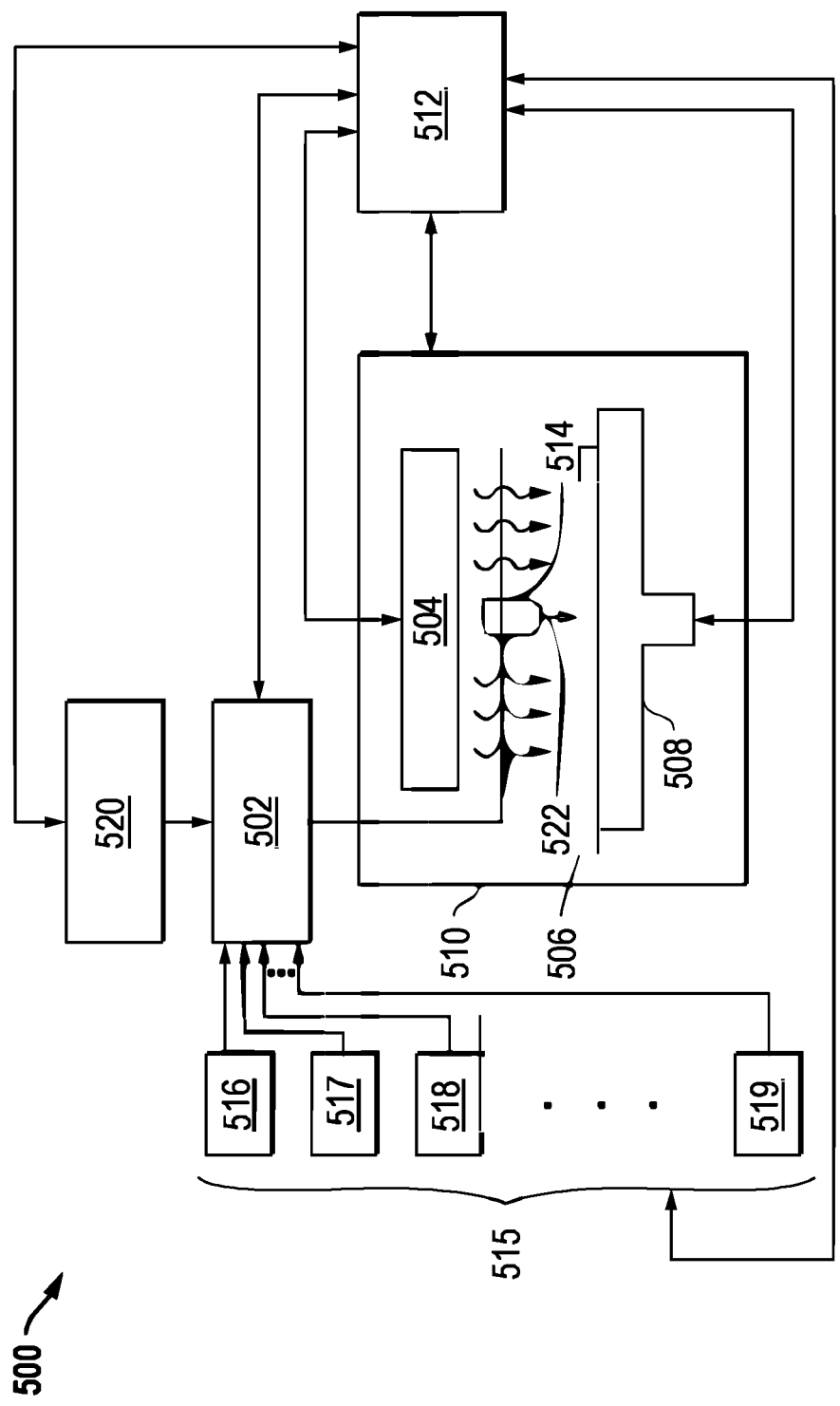
FIG. 5 is an example embodiment for a processing system that provides point-of-use blending to dispense an adjusted mitigation solution to mitigate pattern collapse for a patterned photoresist on a substrate being processed within a process chamber.

Looking now to FIG. 5, an example embodiment 500 for a processing system is shown that provides point-of-use blending to dispense an adjusted mitigation solution 522 to mitigate pattern collapse for a patterned photoresist on a substrate 506 being processed within a process chamber 510. A mitigation solution is stored in a reservoir 520, and this mitigation solution is delivered to a mixer 502. The mixer 502 is also coupled to receive different solution components from one or more additional reservoirs 515. Each of the additional reservoirs 515 can deliver a different solution component to the mixer 502. For example, the first reservoir 516 can provide a first solution component to the mixer 502; the second reservoir 517 can provide a second solution component to the mixer 502; the third reservoir 518 can provide a third solution component to the mixer 502; and so on with the last reservoir 519 providing an Nth solution component to the mixer 502. The delivery of the mitigation solution from the reservoir 520 to the mixer 502 and the delivery of the solution components from the additional reservoirs 515 to the mixer 502 can be controlled by the controller 512. As such, the controller 512 can determine the point-of-use formulation for an adjusted mitigation solution delivered from the mixer 502 to the dispense nozzle 514. This adjusted mitigation solution 522 is then delivered by the dispense nozzle 514 to the substrate 506. The mitigation solution stored within reservoir 520 can be, for example, a surfactant rinse solution having a selected formulation, such as a FIRM™ solution. The mitigation solution components stored in the additional reservoirs 515 can be DIW, one or more additional non-reactant solutions, one or more reactant solutions, and/or other desired solution components.

As also shown for example embodiment 500, the substrate 506 is positioned within the process chamber 510. Further, the substrate 506 (in one example a semiconductor wafer) is held on a substrate holder 508, such as an electrostatic chuck. The substrate holder 508 can also be configured to rotate at a controlled speed to facilitate formation of a photoresist layer on the surface of the substrate 506. The rotation and rotation speed can be controlled, for example, by the controller 512. Additional dispense nozzles and associated delivery systems (not shown) can also be included for the photoresist and/or a developer dispensed on the substrate 506. An illumination system 504 is also provided within the process chamber 510 to illuminate the photoresist layer formed on the substrate 506 into a patterned photoresist layer.

It is also noted that the point-of-use blending described in FIG. 5 and described herein provides significant flexibility. For example, any combination or sequence of mixed or pure chemistry within a single dispense can be implemented in order to tune any specific property of the adjusted mitigation solution 522. Properties of the adjusted mitigation solution 522 that can be tuned with the point-of-use blending include level of reactants or reactive components, level of non-reactants or nonreactive components, pH, contact angle, hydrophobicity, and/or other parameters or physical properties associated with the adjust mitigation solution 522.

Still further, the disclosed embodiments allow for different formulations of the adjusted mitigation solution 522 to be formed using the point-of-use blending based upon particular features formed within the patterned photoresist being rinsed. For example, the same starting mitigation solution can be adjusted and fine-tuned for different photoresist feature sizes and geometries. For examples, contact/hole (C/H) features may require a different reactant concentration as compared to line/space (L/S) features to mitigate residue and pattern collapse type defects. The point-of-use variable blending of FIRM™ solution, therefore, can be used to change formulations at the dispense nozzle just before the dispense based upon feature characteristics, such as feature size, feature geometry, and/or other feature characteristics.

It is further noted that components of the processing system can be coupled to and controlled by a controller 512. The controller 512 can also be coupled to a corresponding memory storage unit and user interface (not shown). Various processing operations can be executed via the user interface, and various processing recipes and operations can be stored in a storage unit. Accordingly, a given substrate 506 can be processed within the process chamber 510 with various techniques. It will be recognized that controller 512 may be coupled to various components of the processing system to receive inputs from and provide outputs to the components.

The controller 512 can be implemented in a wide variety of manners. For example, the controller 512 may be a computer. In another example, the controller may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Figure 6:
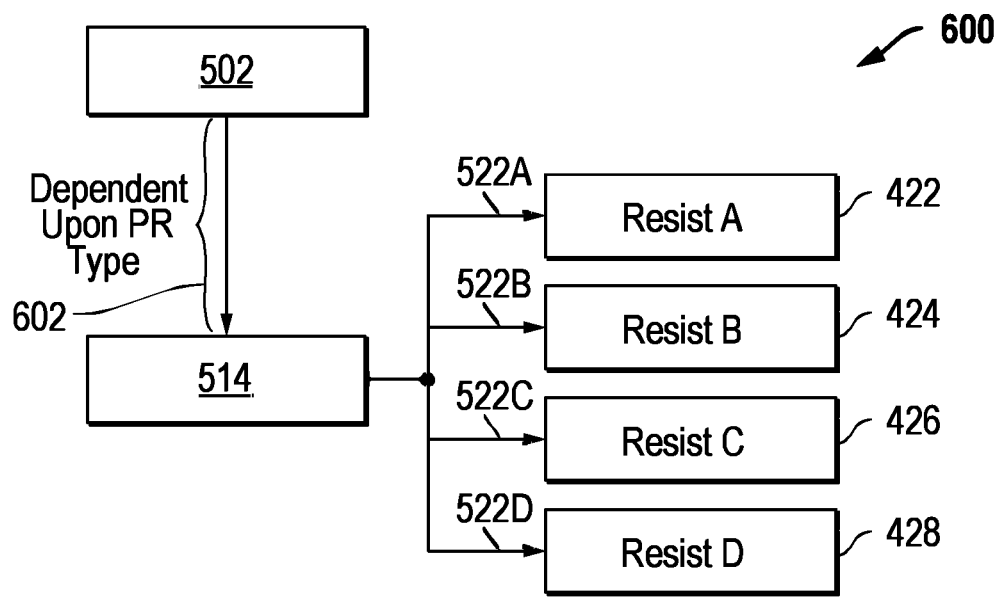
FIG. 6 provides an example embodiment for delivery of different adjusted mitigation solutions for use with multiple different photoresist types.

FIG. 6 provides an example embodiment 600 for delivery of different adjusted mitigation solutions associated with the processing system of FIG. 5 for use with multiple different photoresists types, such as multiple different EUV photoresist types. As described herein, a mitigation solution can be selected as a nominal solution for the rinse treatment, and this solution is then adjusted by point-of-use variable blending in mixer 502 to achieve different adjusted mitigation solutions based upon photoresist types. For embodiment 600, these different adjusted mitigation solutions are represented by the different element numbers 522A, 522B, 522C, and 522D dispensed by dispense nozzle 514. It is understood that only one of these adjusted mitigation solutions 522A/522B/522C/522D would be dispensed at any particular time. In particular as described herein, the adjusted mitigation solution 522A/522B/522C/522D delivered to and dispensed from dispense nozzle 514 is dependent upon the photoresist (PR) type being used for a particular process flow as indicated by bracket 602. For example, the different photoresists types shown for this embodiment are a first photoresist (Resist A) 422, a second photoresist (Resist B) 424, a third photoresist (Resist C) 426, and a fourth photoresist (Resist D) 428. A different adjusted mitigation solution 522A, 522B, 522C, and 522D is dispensed to each of these different photoresist types. It is noted that different numbers of photoresist types and related blending formulations can also be used.

The point-of-use blending of the formulation for the mitigation solution, therefore, can be used to provide a chemical mixture with a selected and precise ratio of reactive and nonreactive components. Further, solution formulations can also be adjusted to have different and selected pH levels and/or other properties. Further, the point-of-use formulation adjustments provide the ability to finely adjust the adjusted mitigation solution depending upon the photoresist interaction in order to improve or optimize the developer/rinse process with respect to rinse treatments. For example, the ability to use a single source of a base mitigation solution, such as a base FIRM™ solution, that is then blended at point-of-use for multiple different photoresists, such as EUV photoresists, reduces delivery system complexity and reduces manufacturing floor space requirements.

Figure 7:
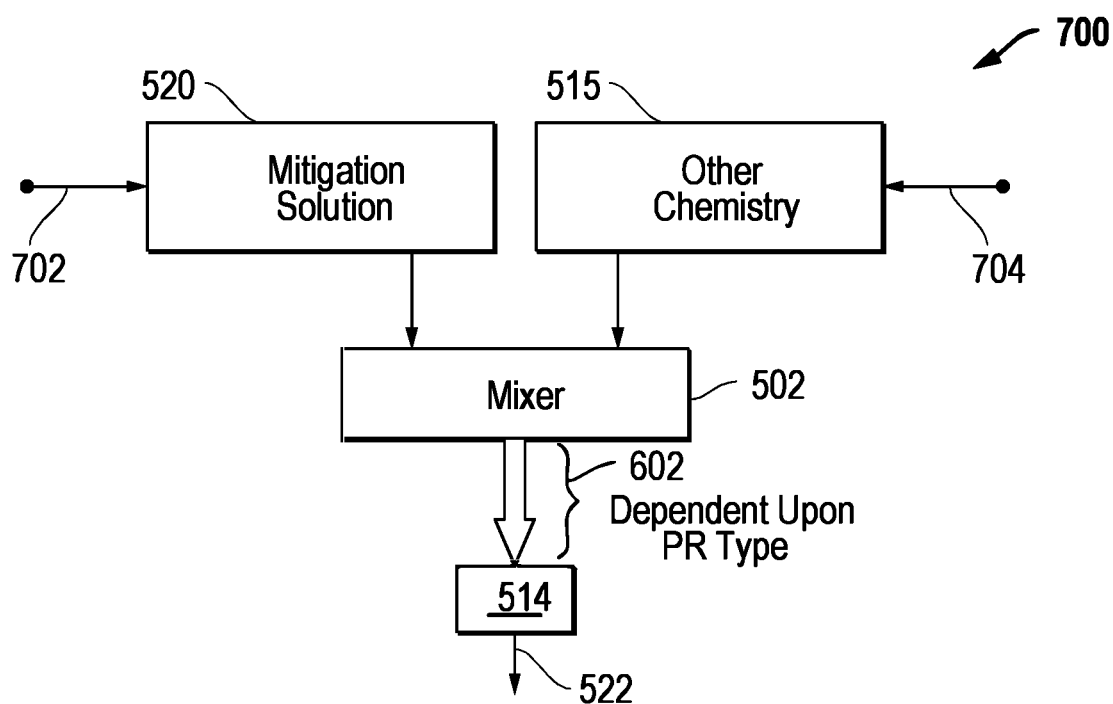
FIG. 7 provides an example embodiment where the chemical composition ratio of nonreactive components to reactive components are adjusted for a surfactant rinse solution, such as a FIRM™ solution, just before it is dispensed by a dispense nozzle to a substrate for a microelectronic workpiece being processed.

FIG. 7 provides an example embodiment 700 where the chemical composition ratio of nonreactive components to reactive components are adjusted for a surfactant rinse solution, such as a FIRM™ solution, just before it is dispensed by dispense nozzle 514 to the substrate for a microelectronic workpiece being processed. The chemical formulation adjustment is performed as point-of-use blending in the mixer 502 that supplies the dispense nozzle 514 as described herein. For example, a mitigation solution, such as a surfactant rinse solution, is provided within a reservoir 520 associated with a process chamber for a processing system. This mitigation solution is injected into the mixer 502 along with DIW or other chemistries injected from one or more additional reservoirs 515. These mitigation solution and solution components are controlled by control signals 702 and 704 from a controller, such as controller 512 in FIG. 5, to determine the chemical composition ratio of nonreactive to reactive components provided to the mixer 502. Other physical properties of the adjusted mitigation solutions 522 can also be adjusted by injection of one or more components from the additional reservoirs 515. The mixer 502 operates to blend the initial mitigation solution from reservoir 520 and the DIW and/or other components from additional reservoirs 515, and the adjusted mitigation solution 522 is dispensed through the dispense nozzle 514 to the substrate for the microelectronic workpiece. Thus, as described above, the adjusted mitigation solution 522 delivered to and dispensed from dispense nozzle 514 is dependent upon the photoresist (PR) type being used for a particular process flow as indicated by bracket 602. Other variations can also be implemented.

Figure 8:
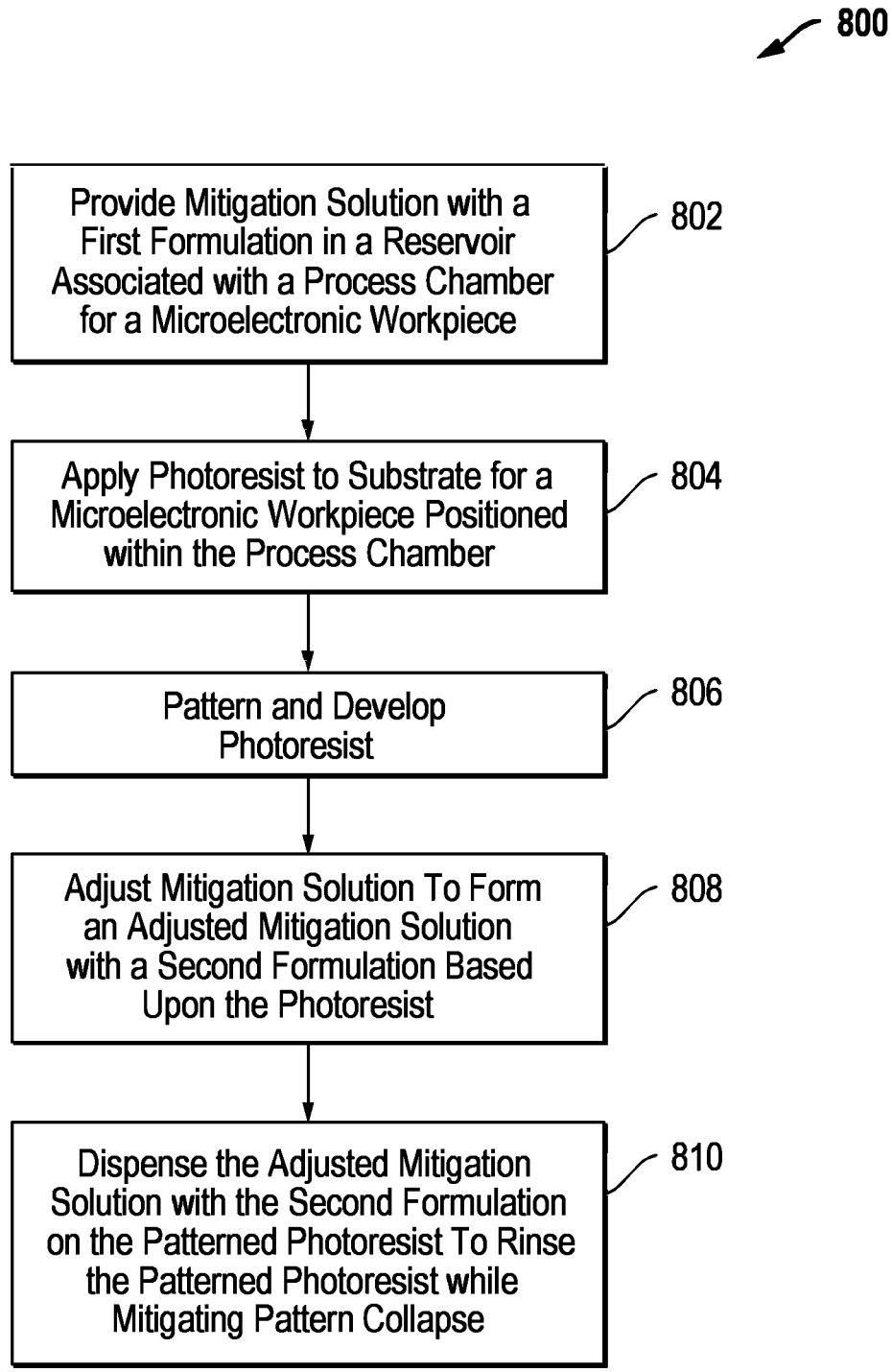
FIG. 8 is a process flow diagram of an example embodiment that applies point-of-use blending of a mitigation solution to dispense an adjusted mitigation solution based upon a photoresist being used within a process chamber.

FIG. 8 is a process flow diagram of an example embodiment 800 that applies point-of-use blending of a mitigation solution to dispense an adjusted mitigation solution based upon a photoresist being used within a process chamber. In block 802, a mitigation solution with a first formulation is provided in a reservoir associated with a process chamber for a microelectronic workpiece. In block 804, a photoresist is applied to a substrate for a microelectronic workpiece positioned within the process chamber. In block 806, the photoresist is patterned and developed. In block 808, the mitigation solution is adjusted to form an adjusted mitigation solution with a second formulation based upon the photoresist. In block 810, the adjusted mitigation solution with the second formulation is dispensed on the patterned photoresist to rinse the patterned photoresist while mitigating pattern collapse. It is noted that additional and/or different process steps can also be used while still taking advantage of the point-of-use blending techniques described herein.

For one embodiment, the developer rinse process can be implemented in a single dispense step. For example, rather than dispensing DIW and then later dispensing an adjusted mitigation solution, such as a FIRM™ solution, a single dispense of an adjusted mitigation solution is used. This single dispense implementation has the benefit of reducing the total process time and improving wafer throughput.

In other embodiments, multiple dispense operations are used. For one example embodiment using a FIRM™ solution, the dispense starts with a DIW-only formulation and is followed by a short blending of DIW plus the FIRM™ solution before a pure FIRM™ solution is dispensed. This technique reduces undesirable effects of changing chemistries with different properties (e.g., PH, surface tension, etc.) too quickly.

Although the disclosed embodiments describe the use of FIRM™ surfactant rinse solutions as the mitigation solution with one or more mitigation solution components, the point-of-use blending techniques can also be used for any other mitigation solutions, components, and chemistries that are used in the development process of photoresist such as other types of surfactant rinses chemistry/solutions. Still further, although the disclosed embodiments describe the use of EUV lithography and EUV photoresists, the point-of-use blending techniques can also be used in any other exposure wavelength lithography technology that requires a traditional development process of photoresist such as, optical lithography (e.g., using argon fluoride (ArF) photoresist, krypton fluoride (KrF) photoresists), x-ray lithography, ion-beam lithography, electron-beam lithography, and/or other lithography processes. Other variations can also be implemented while still taking advantage of the techniques described herein.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that target parameters are achieved for process steps described herein. The operating variables may include, for example, the chamber temperature, chamber pressure, flowrates of gases, frequency and/or power applied to electrode assembly in the generation of plasma, and/or other operating variables for the process steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate including a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium, nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to dispense a rinse solution to mitigate pattern collapse for a patterned photoresist provided on a current workpiece which is being processed in a process chamber, comprising:
   providing a mitigation solution with a first formulation in a reservoir associated with the process chamber;
   providing one or more mitigation solution components in respective additional reservoirs associated with the process chamber;
   determining a type of patterned photoresist that is provided on the current workpiece;
   selecting a formulation which corresponds to the determined type of patterned photoresist provided on the current workpiece:
   adjusting the mitigation solution by delivering, according to the selected formulation, an amount of the mitigation solution and the one or more mitigation solution components to a mixer to mix an adjusted mitigation solution having a second formulation; and
   dispensing the adjusted mitigation solution having the second formulation onto the patterned photoresist provided on the current workpiece to rinse the patterned photoresist while mitigating pattern collapse.

2. The method of claim 1, wherein the adjusted mitigation solution comprises a surfactant rinse solution having the one or more mitigation solution components.

3. The method of claim 1, further comprising forming the patterned photoresist by exposing portions of a photoresist to extreme ultraviolet (EUV) light.

4. The method of claim 3, wherein the photoresist is selected from a plurality of photoresists with different physical properties.

5. The method of claim 1, further comprising further adjusting the mitigation solution based upon one or more features formed within the patterned photoresist.

6. The method of claim 1, wherein the adjusting comprises adjusting at least one of a level of reactive components or a level of nonreactive components within the mitigation solution.

7. The method of claim 6, wherein the adjusting comprises injecting one or more components into a mixer with the mitigation solution to form the adjusted mitigation solution.

8. The method of claim 1, wherein the adjusting comprises adjusting a pH level for the mitigation solution.

9. The method of claim 1, wherein the adjusting comprises blending the mitigation solution with at least one of de-ionized water (DIW) or a mitigation solution component.

10. The method of claim 9, wherein the blending is performed using a mixer coupled to a dispense nozzle positioned within the process chamber.

11. The method of claim 1, wherein the dispensing comprises:
   initially dispensing de-ionized water (DIW) on the patterned photoresist; and
   subsequently dispensing the adjusted mitigation solution on the patterned photoresist.

12. The method of claim 1, wherein the dispensing comprises:
   initially dispensing de-ionized water (DIW) without the adjusted mitigation solution on the patterned photoresist;
   adjusting the mitigation solution with DIW to form the adjusted mitigation solution;
   subsequently dispensing the adjusted mitigation solution on the patterned photoresist; and
   further dispensing the mitigation solution on the patterned photoresist.

13. The method of claim 1, further comprising storing information related to a plurality of predefined types of patterned photoresist and a plurality of predetermined formulations for creating the adjusted mitigation solution, wherein:
   the determining step comprises determining which one of the predefined types of patterned photoresist is provided on the current workpiece being processed within the processing chamber; and
   the selecting step comprises selecting a predetermined formulation which corresponds to the determined type of patterned photoresist provided on the current workpiece.

* * * * *